(12) United States Patent
Chihaya et al.

(10) Patent No.: US 12,469,723 B2
(45) Date of Patent: Nov. 11, 2025

(54) SUBSTRATE PROCESSING APPARATUS AND ABNORMALITY DETECTION METHOD

(71) Applicant: Tokyo Electron Limited, Tokyo (JP)

(72) Inventors: Hiroaki Chihaya, Nirasaki (JP); Tetsuya Miyashita, Nirasaki (JP); Einstein Noel Abarra, Fuchu (JP); Yasuhiko Kojima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 933 days.

(21) Appl. No.: 17/652,332

(22) Filed: Feb. 24, 2022

(65) Prior Publication Data

US 2022/0285182 A1   Sep. 8, 2022

(30) Foreign Application Priority Data

Mar. 8, 2021  (JP) ................ 2021-036649

(51) Int. Cl.
*H01L 21/67* (2006.01)
*H01L 21/683* (2006.01)

(52) U.S. Cl.
CPC .... *H01L 21/67248* (2013.01); *H01L 21/6831* (2013.01); *H01L 21/67173* (2013.01)

(58) Field of Classification Search
CPC .......... H01L 21/67173; H01L 21/6831; H01L 21/67248
See application file for complete search history.

(56) References Cited

U.S. PATENT DOCUMENTS

2018/0059168 A1* 3/2018 Jung ................ H01L 21/67248

FOREIGN PATENT DOCUMENTS

| DE | 112014003838 T5 | * | 4/2016 | ....... H01L 21/02529 |
| JP | 2008-258389 A | | 10/2008 | |
| JP | 2010109350 A | * | 5/2010 | ......... C23C 16/4583 |
| JP | 6611666 B2 | | 11/2019 | |
| KR | 10-2018-0024385 A | | 3/2018 | |

* cited by examiner

*Primary Examiner* — Lisa M Caputo
*Assistant Examiner* — Nyla Gavia
(74) *Attorney, Agent, or Firm* — Armstrong Teasdale LLP

(57) ABSTRACT

A substrate processing apparatus includes: a stage having an electrostatic chuck configured to attract a substrate; a measurement part configured to measure a temperature of the stage; and a detection part configured to detect an abnormality caused by attraction of the substrate by the electrostatic chuck, based on a fluctuation of the temperature of the stage.

6 Claims, 9 Drawing Sheets

SUBSTRATE PROCESSING APPARATUS AND ABNORMALITY DETECTION METHOD

CROSS-REFERENCE TO RELATED APPLICATION

This application is based upon and claims the benefit of priority from Japanese Patent Application No. 2021-036649, filed on Mar. 8, 2021, the entire contents of which are incorporated herein by reference.

TECHNICAL FIELD

The present disclosure relates to a substrate processing apparatus and an abnormality detection method.

BACKGROUND

In a substrate processing apparatus used in a semiconductor manufacturing apparatus, an electrostatic chuck is used to hold a processing target substrate.

PRIOR ART DOCUMENT

Patent Document

Patent Document 1: Japanese Patent No. 6611666

SUMMARY

Some embodiments of the present disclosure provide a technique for monitoring whether a processing target substrate is attracted to a stage by an electrostatic chuck.

According to one embodiment of the present disclosure, there is provided a substrate processing apparatus including: a stage having an electrostatic chuck configured to attract a substrate; a measurement part configured to measure a temperature of the stage; and a detection part configured to detect an abnormality caused by attraction of the substrate by the electrostatic chuck, based on a fluctuation of the temperature of the stage.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
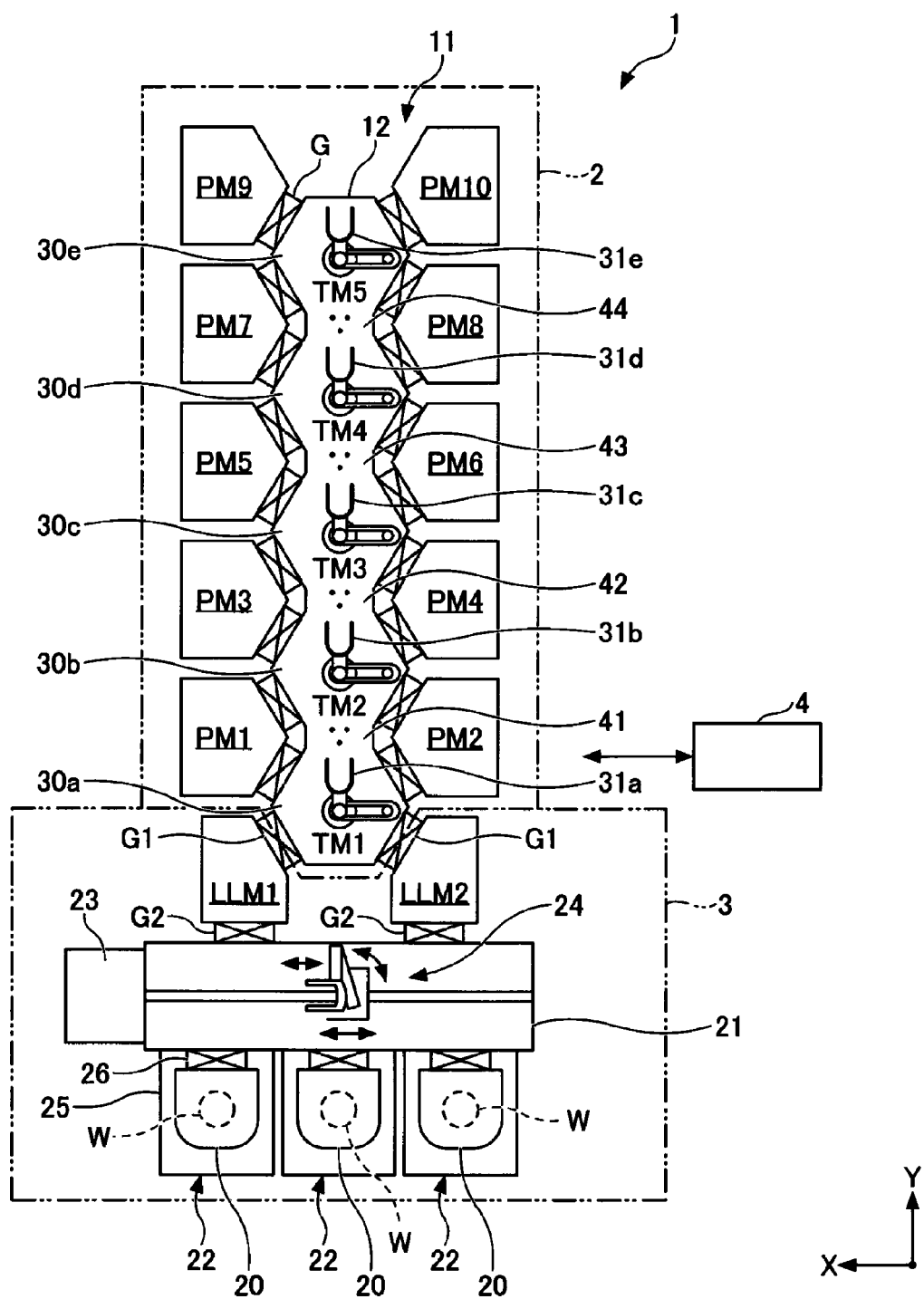
FIG. 1 is a schematic sectional view of an example of a semiconductor manufacturing apparatus according to the present embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the subject specification and the drawings, substantially the same components are designated by like reference numerals, and the duplicate description will be omitted. For ease of understanding, the scale of each part in the drawings may differ from the actual scale.

In the directions such as parallel, right angle, orthogonal, horizontal, vertical, up/down, left/right, and the like, a deviation that does not impair the effects of the embodiment is allowed. The shape of a corner portion is not limited to a right angle and may be rounded in a bow shape. Parallel, right angle, orthogonal, horizontal and vertical may include substantially parallel, substantially right angle, substantially orthogonal, substantially horizontal and substantially vertical.

<Semiconductor Manufacturing Apparatus 1>

FIG. 1 is a schematic sectional view of a semiconductor manufacturing apparatus 1 which is an example of the semiconductor manufacturing apparatus according to the present embodiment. The semiconductor manufacturing apparatus 1 performs processes (desired processes such as etching, film formation, and ashing) on a substrate W. The semiconductor manufacturing apparatus 1 includes a processing part 2, a loading/unloading part 3, and a controller 4. The substrate W is not particularly limited and may be, for example, a semiconductor wafer (hereinafter simply referred to as a wafer).

The loading/unloading part 3 loads and unloads a substrate, for example, a wafer with respect to the processing part 2. The processing part 2 includes process modules PM1 to PM10 (ten process modules, in the present embodiment) that apply a desired vacuum process to the wafer. The wafer is serially transferred (sequentially transferred) by a first transfer device 11 to the process modules PM1 to PM10.

The first transfer device 11 includes transfer modules TM1 to TM5. The transfer modules TM1 to TM5 have containers 30a, 30b, 30c, 30d and 30e having a hexagonal plan-view shape and held in a vacuum, respectively. Further, the transfer modules TM1 to TM5 have transfer mechanisms 31a, 31b, 31c, 31d and 31e having an articulated structure and provided in the containers 30a, 30b, 30c, 30d and 30e, respectively.

Delivery parts 41, 42, 43 and 44 as transfer buffers are provided between the transfer mechanisms 31a, 31b, 31c, 31d and 31e of the transfer modules TM1 to TM5, respectively. The containers 30a, 30b, 30c, 30d and 30e of the transfer modules TM1 to TM5 communicate with each other to form one transfer chamber 12.

The transfer chamber 12 extends in the Y direction in the figure. The process modules PM1 to PM10 are connected to both sides of the transfer chamber 12, five per each side, via gate valves G that can be opened and closed. The gate valves G of the process modules PM1 to PM10 are opened when the transfer modules TM1 to TM5 access the process modules PM1 to PM10, and are closed when a desired process is performed.

The loading/unloading part 3 is connected to one end side of the processing part 2. The loading/unloading part 3 includes an atmospheric transfer chamber 21, three load ports 22, an aligner module 23, two load lock modules LLM1 and LLM2, and a second transfer device 24. The load ports 22, the aligner module 23 and the load lock modules LLM1 and LLM2 are connected to the atmospheric transfer chamber 21. Further, the second transfer device 24 is provided in the atmospheric transfer chamber 21.

The atmospheric transfer chamber 21 has a rectangular parallelepiped shape in which the X direction is the longitudinal direction in the figure. The three load ports 22 are provided on the long-side wall portion of the atmospheric transfer chamber 21 on the opposite side of the processing part 2. Each load port 22 includes a stage 25 and a transfer port 26. A FOUP 20, which is a substrate container for accommodating the wafers, is mounted on the stage 25. The FOUP 20 on the stage 25 is connected to the atmospheric transfer chamber 21 in a sealed state via the transfer port 26. The aligner module 23 is connected to one short-side wall portion of the atmospheric transfer chamber 21. Wafer alignment is performed in the aligner module 23.

The two load lock modules LLM1 and LLM2 are used for enabling wafer transfer between the atmospheric transfer chamber 21 having an atmospheric pressure and the transfer chamber 12 having a vacuum atmosphere. The pressure in the two load lock modules LLM1 and LLM2 is variable between the atmospheric pressure and the pressure which is substantially the same as the pressure in the transfer chamber 12. Each of the two load lock modules LLM1 and LLM2 has two transfer ports. One transport port is connected to the long-side wall portion of the atmospheric transfer chamber 21 on the side of the processing part 2 via a gate valve G2. The other transport port is connected to the transfer chamber 12 of the processing part 2 via the gate valve G1.

The load lock module LLM1 is used when the wafer is transferred from the loading/unloading part 3 to the processing part 2. The load lock module LLM2 is used when the wafer is transferred from the processing part 2 to the loading/unloading part 3. The load lock modules LLM1 and LLM2 may perform a process such as a degassing process or the like.

The second transfer device 24 in the atmospheric transfer chamber 21 has an articulated structure and transfers wafers to and from the FOUPs 20 on the load ports 22, the aligner module 23 and the load lock modules LLM1 and LLM2. Specifically, the second transfer device 24 takes out an unprocessed wafer from the FOUP 20 of the load port 22, transfers the unprocessed wafer to the aligner module 23, and transfers the unprocessed wafer from the aligner module 23 to the load lock module LLM1. Further, the second transfer device 24 receives a processed wafer transferred from the processing part 2 to the load lock module LLM2 and transfers the processed wafer to the FOUP 20 of the load port 22. FIG. 1 shows an example in which one pick of the second transfer device 24 receives the wafer. However, the number of picks may be two.

The first transfer device 11 and the second transfer device 24 constitute a transfer part of the semiconductor manufacturing apparatus 1. In the processing part 2, the process modules PM1, PM3, PM5, PM7 and PM9 are arranged in order from the load lock module LLM1 side on one side of the transfer chamber 12. Further, in the processing part 2, the process modules PM2, PM4, PM6, PM8 and PM10 are arranged in order from the load lock module LLM2 side on the other side of the transfer chamber 12. In the first transfer device 11, the transfer modules TM1, TM2, TM3, TM4 and TM5 are arranged in order from the load lock modules LLM1 and LLM2 side.

The transfer mechanism 31a of the transfer module TM1 can access the load lock modules LLM1 and LLM2, the process modules PM1 and PM2, and the delivery part 41. The transfer mechanism 31b of the transfer module TM2 can access the process modules PM1, PM2, PM3 and PM4, and the delivery parts 41 and 42.

The transfer mechanism 31c of the transfer module TM3 can access the process modules PM3, PM4, PM5 and PM6, and the delivery parts 42 and 43. The transfer mechanism 31d of the transfer module TM4 can access the process modules PM5, PM6, PM7 and PM8, and the delivery parts 43 and 44. The transfer mechanism 31e of the transfer module TM5 can access the process modules PM7, PM8, PM9 and PM10, and the delivery part 44.

Figure 2:
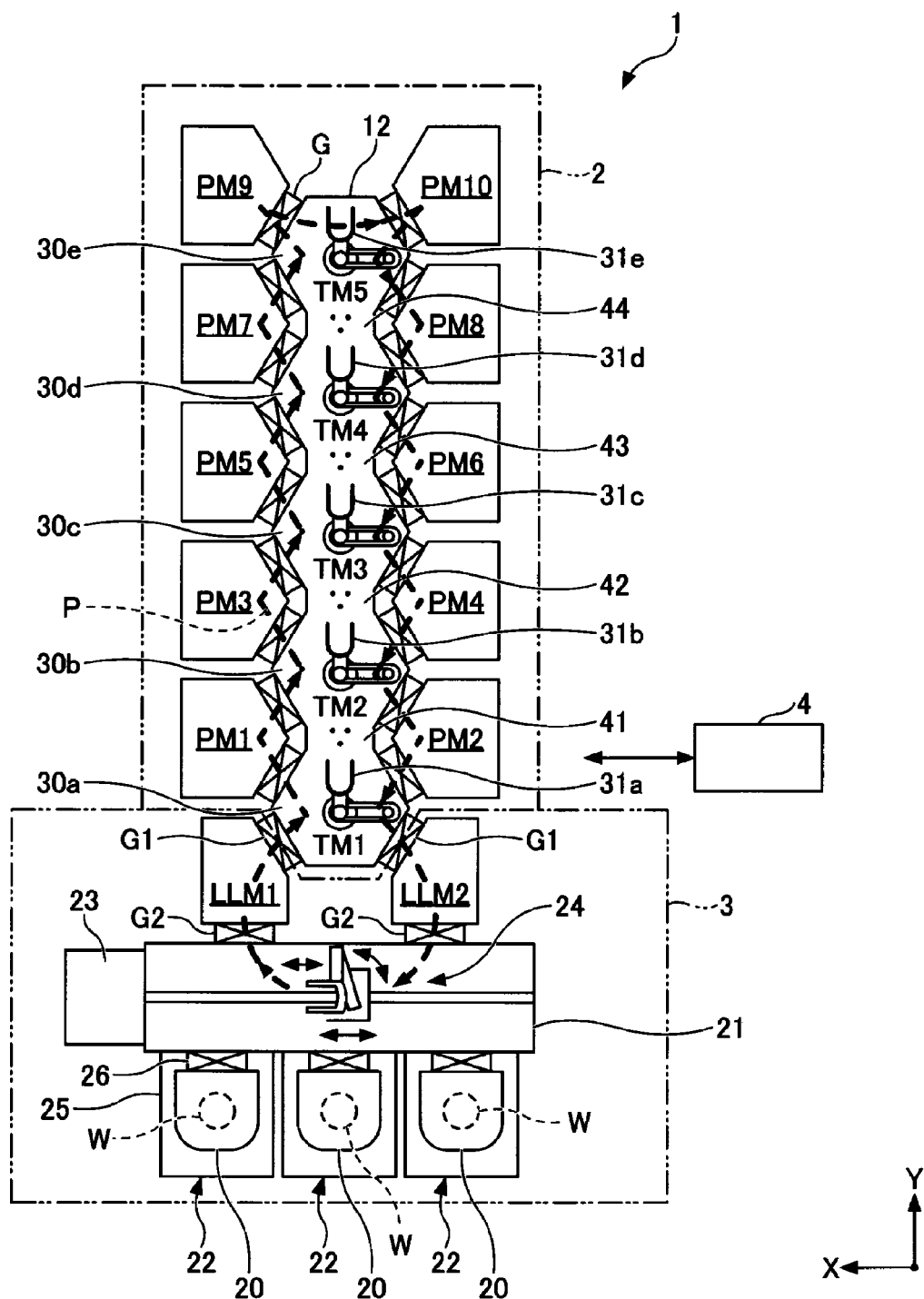
FIG. 2 is a schematic sectional view showing an example of a wafer transfer path of the semiconductor manufacturing apparatus according to the present embodiment.

The transfer modules TM1 to TM5 of the second transfer device 24 and the first transfer device 11 are configured as shown in FIG. 1. Therefore, as shown in FIG. 2, the wafers taken out from the FOUP 20 are serially transferred in one direction along the substantially U-shaped path P in the processing part 2 to be processed in the process modules PM1 to PM10, and returned to the FOUP 20. That is, the wafers are serially transferred in the order of the process modules PM1, PM3, PM5, PM7, PM9, PM10, PM8, PM6, PM4 and PM2 and are subjected to desired processes.

The semiconductor manufacturing apparatus 1 may be used for manufacturing, for example, a stacked film (MTJ (Magneto-resistive Tunnel Junction) film) used for an MRAM (Magneto-resistive Random Access Memory). The MTJ film is manufactured through desired processes such as a pre-cleaning process, a film-forming process, an oxidizing process, a heat treatment process, a cooling process, and the like. Each of these desired processers is performed by the process modules PM1 to PM10. One or more of the process modules PM1 to PM10 may be standby modules in which the wafer waits.

The controller 4 controls each constituent part of the semiconductor manufacturing apparatus 1. The controller 4 controls, for example, the transfer modules TM1 to TM5 (transfer mechanisms 31a to 31e), the second transfer device 24, the process modules PM1 to PM10, the load lock modules LLM1 and LLM2, the transfer chamber 12, and the gate valves G, G1 and G2. The controller 4 is, for example, a computer.

<Substrate Processing Apparatus 5>

Figure 3:
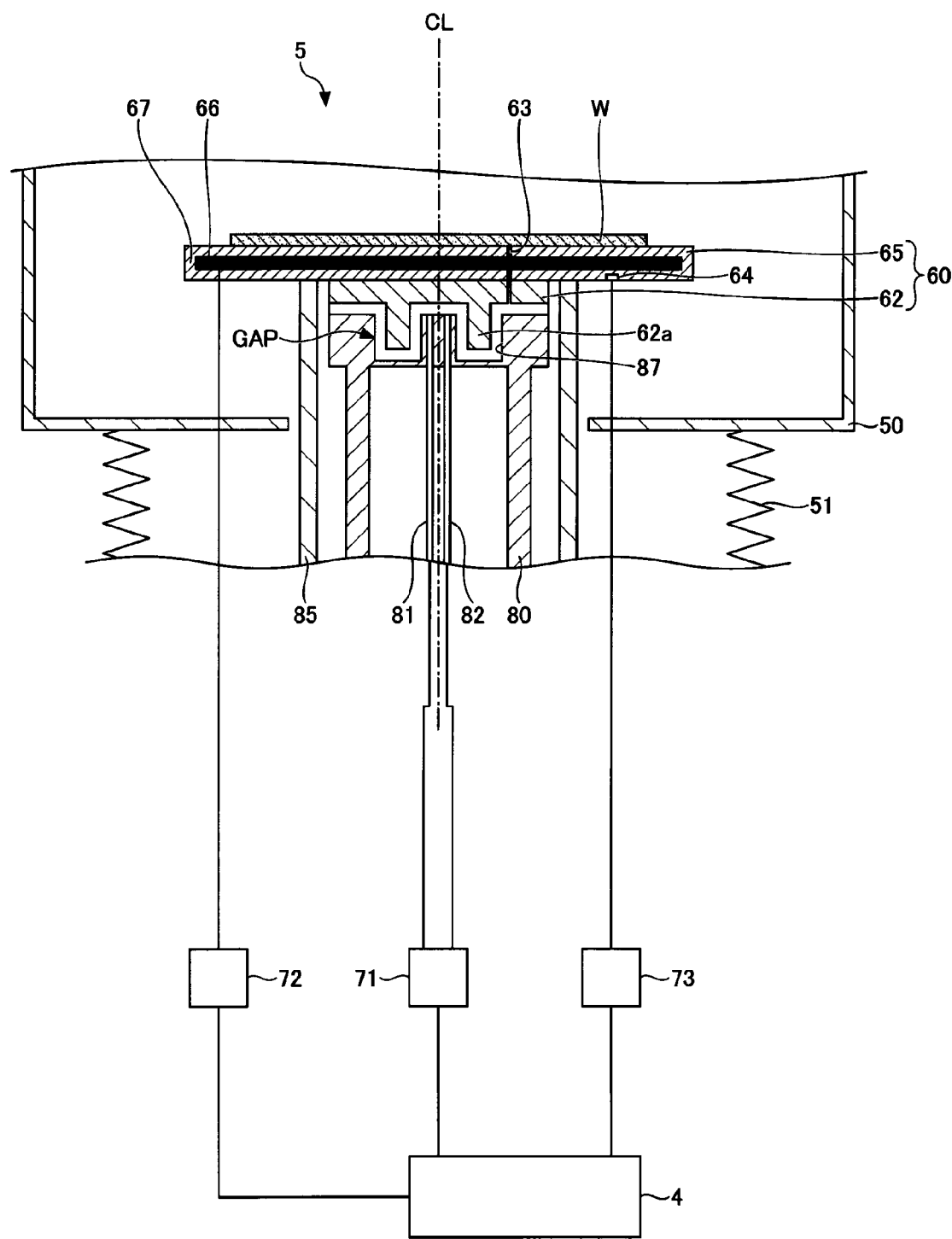
FIG. 3 is a schematic sectional view of an example of a substrate processing apparatus of the semiconductor manufacturing apparatus according to the present embodiment.

Next, the substrate processing apparatus 5 used in any of the process modules PM1 to PM10 will be described. FIG. 3 is a schematic sectional view of a substrate processing apparatus 5 which is an example of the substrate processing apparatus of the semiconductor manufacturing apparatus according to the present embodiment.

The substrate processing apparatus 5 includes a stage 60 on which the substrate W is mounted inside the processing container 50. Further, the substrate processing apparatus 5 includes a refrigeration medium 80. Further, the substrate processing apparatus 5 includes an outer cylinder 85 that supports the stage 60.

The stage 60 includes an upper electrostatic chuck 65 on which the substrate W is mounted, and a lower plate 62. The electrostatic chuck 65 has a chuck electrode 66 embedded in a dielectric film. A predetermined potential is applied to the chuck electrode 66 from a DC power supply 72. The plate 62 is made of copper (Cu) having high thermal conductivity.

Since the stage 60 includes the electrostatic chuck 65, the stage 60 can attract the substrate W with the electrostatic chuck 65 and can fix the substrate W to the upper surface of the stage 60. In addition to being the stacked body of the electrostatic chuck 65 and the plate 62, the stage 60 may be formed entirely by one plate or may be integrally formed by sintering or the like.

Further, the stage 60 is formed with a through-hole 63 that vertically penetrates the electrostatic chuck 65 and the plate 62. The through-hole 63 communicates with a gap GAP existing below the stage 60. The refrigerant supplied to the gap GAP is supplied to between the upper surface of the stage 60 (electrostatic chuck) and the lower surface of the substrate W via the through-hole 63. As the refrigerant is supplied to between the upper surface of the stage 60 (electrostatic chuck) and the lower surface of the substrate W via the through-hole 63, the cold energy of the refrigerant or the refrigeration medium 80 can be efficiently transferred to the substrate W.

In the example shown in FIG. 3, the refrigerant flowing through a refrigerant supply flow path 81 is supplied to the lower surface of the substrate W through the through-hole 63. Further, the refrigerant discharged through the through-hole 63 flows through a refrigerant discharge flow path 82 and is discharged. The supply and discharge of the refrigerant is not limited to the example shown in FIG. 3 but may be other refrigerant supply and discharge forms. For example, an independent refrigerant flow path, which is different from the refrigerant supply flow path 81 and the refrigerant discharge flow path 82, may be provided with respect to the through-hole 63, and the refrigerant may be supplied and discharged through the through-hole 63 using the independent refrigerant flow path.

On the lower surface of the plate 62 constituting the stage 60, a protrusion portion 62a protruding toward the refrigeration medium 80 is formed. The protrusion portion 62a in the illustrated example is an annular protrusion portion that surrounds the central axis CL of the stage 60. On the other hand, a recess portion 87 into which the protrusion portion 62a is loosely fitted is formed on the upper surface of the refrigeration medium 80, i.e., the surface of the stage 60 facing the protrusion portion 62a. The recess portion 87 in the illustrated example has an annular shape surrounding the central axis CL of the stage 60.

The stage 60 is supported by the outer cylinder 85. The outer cylinder 85 is arranged so as to cover the outer peripheral surface of the upper portion of the refrigeration medium 80. The upper portion of the outer cylinder 85 enters the inside of the processing container 50 and supports the stage 60 inside the processing container 50. The outer cylinder 85 includes a cylinder having an inner diameter slightly larger than the outer diameter of the refrigeration medium 80. The outer cylinder 85 directly supports the stage 60. The outer cylinder 85 is made of a metal such as stainless steel or the like.

The substrate processing apparatus 5 includes a substantially cylindrical bellows 51 arranged outside the outer cylinder 85. The bellows 51 is a metal bellows structure that can be expanded and contracted in the vertical direction. The bellows 51 surrounds the outer cylinder 85 and separates the pressure-adjustable internal space of the processing container 50 from the external space of the processing container 50.

The refrigeration medium 80 is fixed to a refrigerator. The upper portion of the refrigeration medium 80 is accommodated inside the processing container 50. The refrigeration medium 80 is formed of copper (Cu) or the like having high thermal conductivity. The refrigeration medium 80 has a substantially columnar shape. The refrigeration medium 80 is arranged so that the center thereof coincides with the central axis CL of the stage 60.

The refrigeration medium 80 has the refrigerant supply flow path 81 that supplies a refrigerant (cooling gas) to the gap GAP between the refrigeration medium 80 and the stage 60, and the refrigerant discharge flow path 82 that discharges the refrigerant heated by the heat transfer from the stage 60. The refrigerant supply flow path 81 and the refrigerant discharge flow path 82 are connected to a refrigerant supply device 71.

The refrigerant supplied from the refrigerant supply device 71 flows through the refrigerant supply flow path 81 and is supplied to the gap GAP. On the other hand, the refrigerant discharged from the gap GAP flows through the refrigerant discharge flow path 82 and is discharged to the refrigerant supply device 71. The refrigerant supply flow path and the refrigerant discharge flow path may be formed by the same flow path. As the refrigerant supplied to the gap GAP to cool the stage 60, a helium (He) gas having high thermal conductivity is preferably used.

The refrigerant supply device 71 is connected to the controller 4. The refrigerant supply device 71 supplies a refrigerant having a set temperature to the refrigerant supply flow path 81. Further, the refrigerant supply device 71 collects the refrigerant returned from the refrigerant discharge flow path 82, adjusts the temperature of the refrigerant to a set temperature, and supplies the refrigerant to the refrigerant supply flow path 81.

The stage 60 includes a temperature sensor 64 arranged in the electrostatic chuck 65. The temperature sensor 64 is connected to a temperature converter 73. The temperature converter 73 converts the signal from the temperature sensor into a temperature signal and outputs the temperature signal to the controller 4. The controller 4 measures the temperature of the stage 60 by the temperature sensor 64. The temperature sensor 64 is an example of a measurement part that measures the temperature of the stage 60.

<Abnormality Detection Method of Substrate Processing Apparatus 5>

Figure 4:
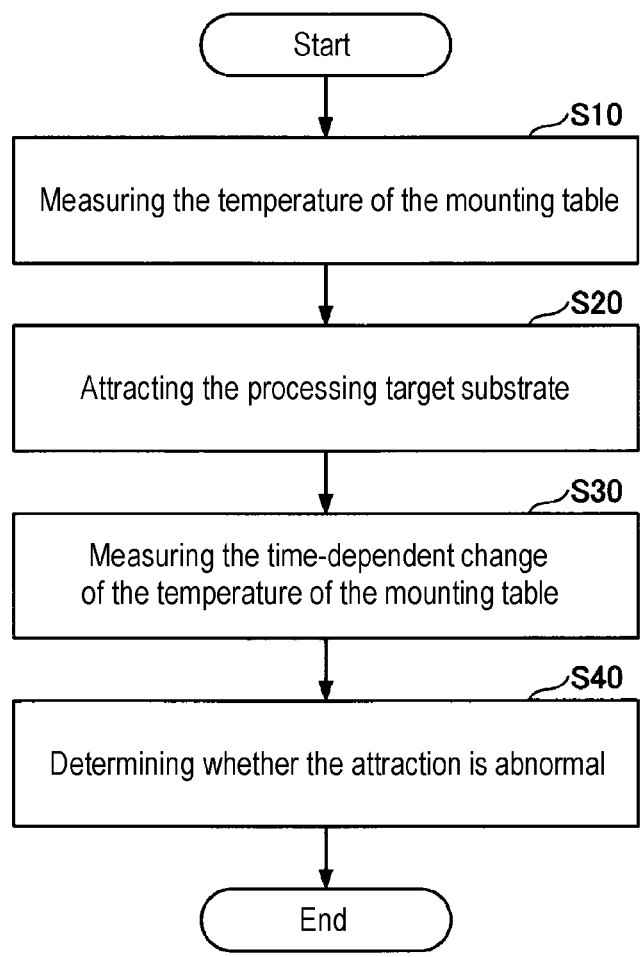
FIG. 4 is a flowchart showing an example of an abnormality detection method using the substrate processing apparatus of the semiconductor manufacturing apparatus according to the present embodiment.

The abnormality detection method performed by the controller 4 will be described. FIG. 4 is a flowchart showing an example of an abnormality detection method of a substrate processing apparatus 5 which is an example of the substrate processing apparatus of the semiconductor manufacturing apparatus according to the present embodiment.

First, the substrate W is mounted on the electrostatic chuck 65 of the stage 60 by any of the transfer modules TM1, TM2, TM3, TM4 and TM5.

Before the controller 4 starts the abnormality detection method, it is assumed that the substrate W is not electrostatically attracted by the electrostatic chuck 65.

The controller 4 measures the initial temperature of the stage 60 before the electrostatic chuck 65 attracts the substrate W (step S10). The initial temperature is the temperature of the stage 60 before attracting the substrate W on the stage 60.

The temperature of the stage 60 is controlled to, for example, a set temperature. For example, the substrate processing apparatus 5 is controlled so that the temperature of the stage 60 becomes −16.5 degrees C. before the electrostatic chuck 65 attracts the substrate W.

The initial temperature thus measured may be a moving average of the temperatures of the stage 60 before the set time before the electrostatic chuck 65 attracts the substrate W or an average of the temperatures of the stage 60 in a predetermined period before the set time before the electrostatic chuck 65 attracts the substrate W. The set time may be determined, for example, by evaluation using an actual machine.

When the measurement of the initial temperature is completed, the controller 4 controls the DC power supply 72 to start attraction of the substrate W (step S20).

The controller 4 starts measurement of a time-dependent change of the temperature of the stage 60 simultaneously with the start of attraction of the substrate W (step S30).

For example, a case where the substrate W having a temperature of 350 degrees C. is cooled to a temperature of −23 degrees C. will be described. The temperature of the substrate W is higher than the temperature of the stage 60.

After the electrostatic chuck 65 attracts the substrate W, heat is transferred from the substrate W to the electrostatic chuck 65. The temperature of the electrostatic chuck 65 rises due to the heat transfer from the substrate W to the electrostatic chuck 65.

Next, the abnormality of attraction on the electrostatic chuck 65 is determined based on the time-dependent change of the temperature of the stage 60 measured in step S30 (step S40).

Step S40 is an example of a step of detecting an abnormality in the attraction of the substrate W by the electrostatic chuck 65.

The heat transfer coefficient between the substrate W and the electrostatic chuck 65 differs depending on the state in which the electrostatic chuck 65 attracts the substrate W. For example, when the electrostatic chuck 65 strongly attracts the substrate W, the heat transfer coefficient between the substrate W and the electrostatic chuck 65 becomes high. On the other hand, when the electrostatic chuck 65 weakly attracts the substrate W, the heat transfer coefficient between the substrate W and the electrostatic chuck 65 becomes low.

Therefore, when the electrostatic chuck 65 strongly attracts the substrate W, a large amount of heat is transferred from the substrate W to the electrostatic chuck 65, and the temperature of the electrostatic chuck 65 is changed significantly.

On the other hand, when the electrostatic chuck 65 weakly attracts the substrate W, the heat transferred from the substrate W to the electrostatic chuck 65 is less than that in the case where the electrostatic chuck 65 strongly attracts the substrate W. Therefore, the change in temperature of the electrostatic chuck 65 is smaller than that in the case where the electrostatic chuck 65 strongly attracts the substrate W.

Therefore, it is possible to detect an abnormality in the attraction of the electrostatic chuck 65 based on the fluctuation in the temperature of the stage 60 caused by the attraction of the substrate W by the electrostatic chuck 65. For example, the controller 4 determines that the attraction is abnormal if the temperature fluctuation of the stage 60 is small when the electrostatic chuck 65 attracts the substrate W. Then, it is possible to monitor whether the substrate W is attracted to the stage 60 by the electrostatic chuck 65.

The controller 4 is an example of a detection part.

<Evaluation Index of Temperature Fluctuation>

A method of calculating an evaluation index of the temperature fluctuation in the stage 60 caused by the attraction of the substrate W by the electrostatic chuck 65 will be described.

[Difference Integration Method]

Figure 5:
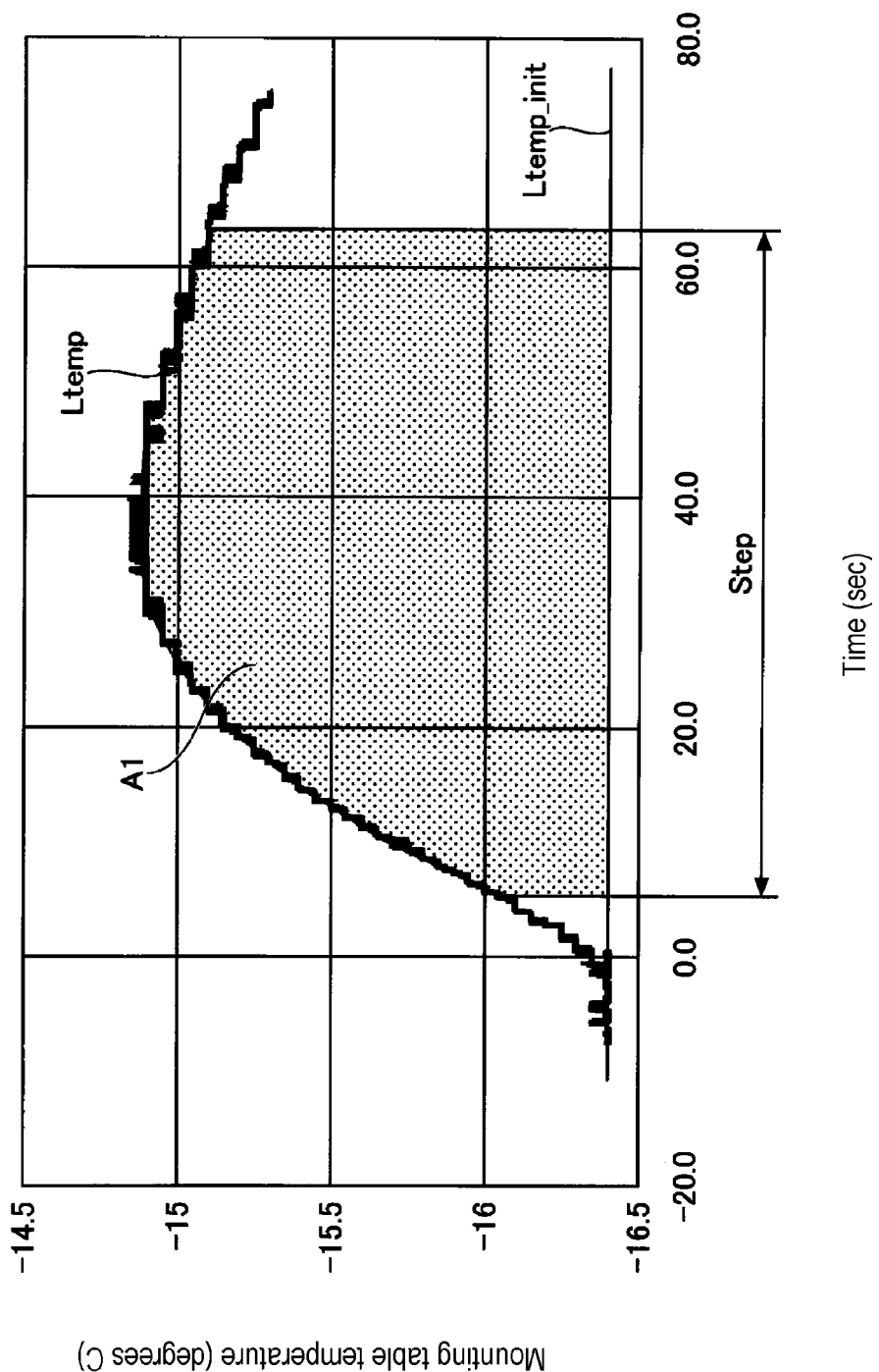
FIG. 5 is an exemplary diagram illustrating the abnormality detection method using the substrate processing apparatus of the semiconductor manufacturing apparatus according to the present embodiment.

In order to calculate the temperature fluctuation of the stage 60, the controller 4 integrates the temperature fluctuation with respect to a certain reference value (reference temperature value Ti) and calculates the integrated temperature fluctuation as an evaluation index. FIG. 5 is a diagram illustrating a difference integration method of an abnormality detection method using the substrate processing apparatus 5 of the semiconductor manufacturing apparatus according to the present embodiment. The line Ltemp in FIG. 5 represents the temperature of the stage 60, specifically, the temperature detected by the temperature sensor 64.

In the difference integration method, an integral value of a difference with respect to a certain reference value is calculated during the period of the processing step.

In FIG. 5, a step for mounting the substrate W is performed until the time of 5 seconds. For example, the substrate W is mounted on the pins provided on the stage 60 by any of the transfer modules TM1, TM2, TM3, TM4 and TM5. Then, the pins are retracted into the stage 60. By retracting the pins into the stage 60, the substrate W is mounted on the stage 60.

During the step for mounting the substrate W, the temperature (reference temperature) of the stage 60 is measured. The reference temperature is, for example, the initial temperature in step S10. For example, the line Ltemp_init in FIG. 5 represents a reference temperature value Ti.

Then, at the time of 5 seconds, the electrostatic chuck 65 starts attraction of the substrate W. When the electrostatic chuck 65 attracts the substrate W, heat is transferred from the substrate W to the electrostatic chuck 65, whereby the temperature of the stage 60 including the electrostatic chuck 65 rises.

Then, the substrate W is processed for 57.5 seconds, which is a time period between the time of 5 seconds and the time of 62.5 seconds (the period of "Step" in FIG. 5). The processing of the substrate is, for example, a process of stacking a material on the substrate W.

The difference with respect to the reference temperature in the process is integrated. The difference integration value WS is obtained by the following Equation (1) where the start time of the process is t1 (=5) seconds, the end time is t2 (=62.5) seconds, and the temperature value of the stage 60 measured at time t is T(t).

$$WS = \int_{t1}^{t2} (T(t) - ti) dt \quad (1)$$

Specifically, the area A1 in FIG. 5 is obtained. The difference integral value WS may be referred to as a temperature integral value.

Then, the obtained difference integral value WS is compared with a set threshold value Wth in the step. When the obtained difference integral value WS is smaller than the set threshold value Wth, it is determined that the attraction on the electrostatic chuck 65 is not sufficient. That is, the controller 4 determines that the attraction of the substrate W by the electrostatic chuck 65 is abnormal.

In the case of a substrate processing process including plural steps, when obtaining the difference integral value WS, the difference with respect to the reference temperature value may be accumulated each time when each step is passed from the first step. Then, the difference integral value WS may be obtained from the difference between the cumulative value and the cumulative value at the end of the previous step.

Figure 6:
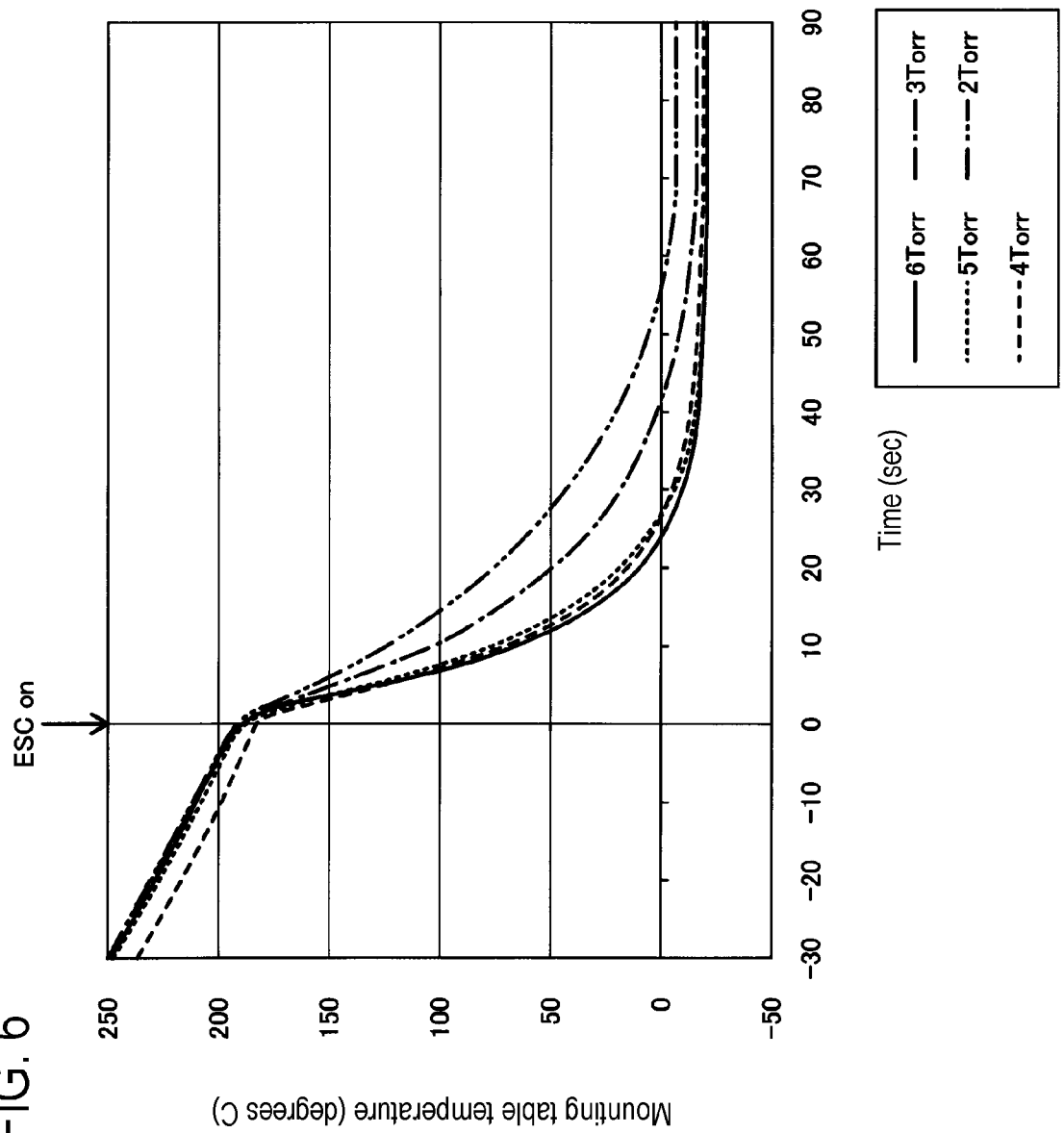
FIG. 6 is an exemplary diagram illustrating the abnormality detection method using the substrate processing apparatus of the semiconductor manufacturing apparatus according to the present embodiment.

FIG. 6 is a diagram showing a change in the temperature of the stage 60 when the pressure of the cooling gas supplied from the electrostatic chuck 65 to the rear surface of the substrate W is changed. When the electrostatic chuck 65 strongly attracts the substrate W, the leakage of the cooling gas is reduced and the pressure of the cooling gas is increased. Further, when the electrostatic chuck 65 weakly attracts the substrate W, the leakage of the cooling gas increases and the pressure of the cooling gas becomes low as compared with the case where the substrate W is strongly attracted. In the present embodiment, the attraction state of the substrate W by the electrostatic chuck 65 is changed by changing the pressure of the cooling gas.

When the pressure of the cooling gas supplied to the rear surface of the substrate W becomes low, the heat transferred from the substrate W to the electrostatic chuck 65 decreases. Therefore, when the pressure of the cooling gas supplied to the rear surface of the substrate W becomes low, the change in the temperature of the stage 60 becomes small.

Figure 7:
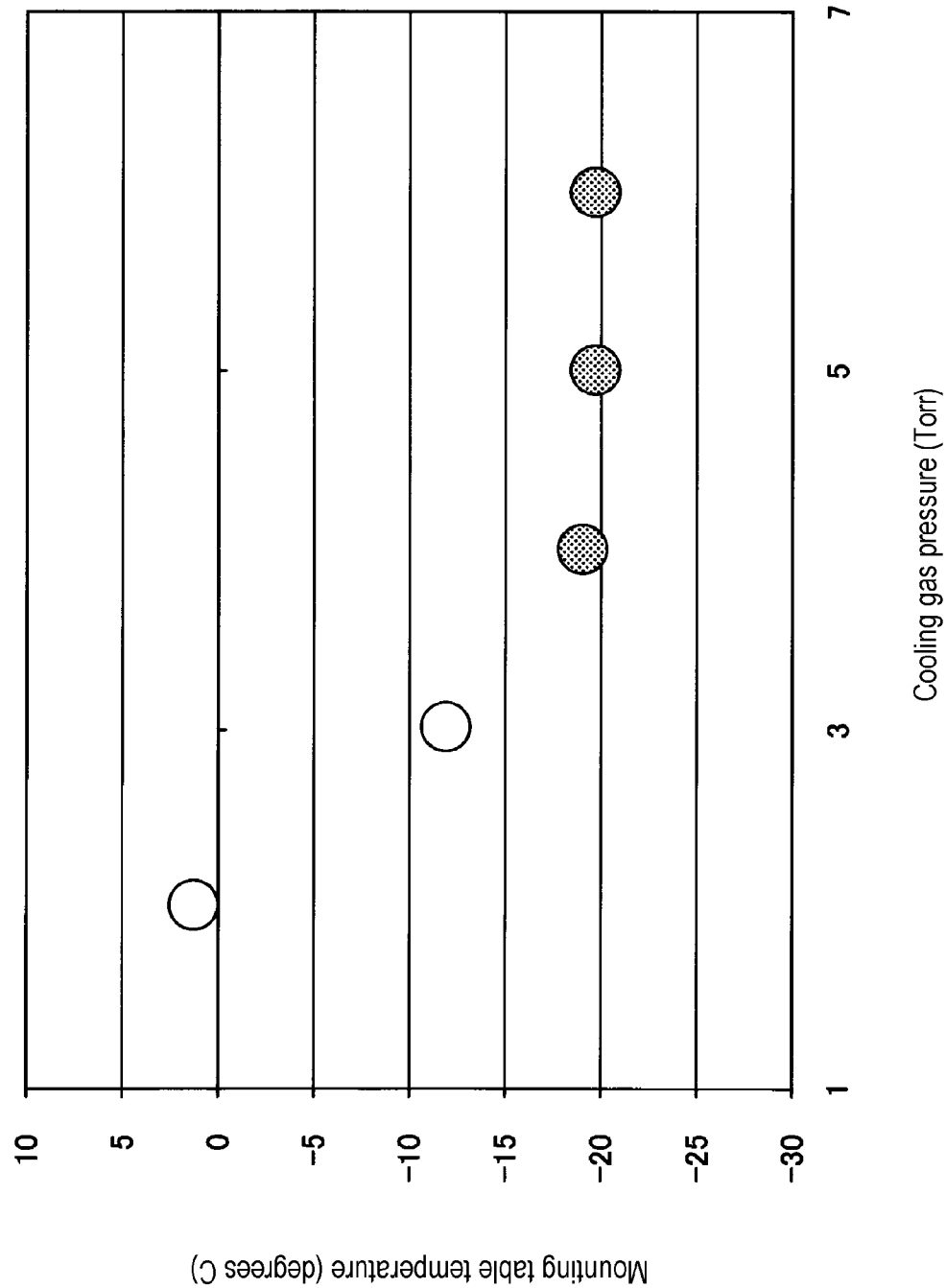
FIG. 7 is an exemplary diagram illustrating the abnormality detection method using the substrate processing apparatus of the semiconductor manufacturing apparatus according to the present embodiment.

FIG. 7 is a graph showing the temperature of the stage 60 after 65 seconds have elapsed from the start of attraction of the substrate W by the electrostatic chuck 65. If the pressure of the cooling gas is 4 Torr or more, the temperature of the stage 60 becomes −20 degrees C. On the other hand, if the pressure of the cooling gas is 3 Torr or less, the temperature of the stage 60 becomes higher than that in a case where the pressure of the cooling gas is 4 Torr or more.

Figure 8:
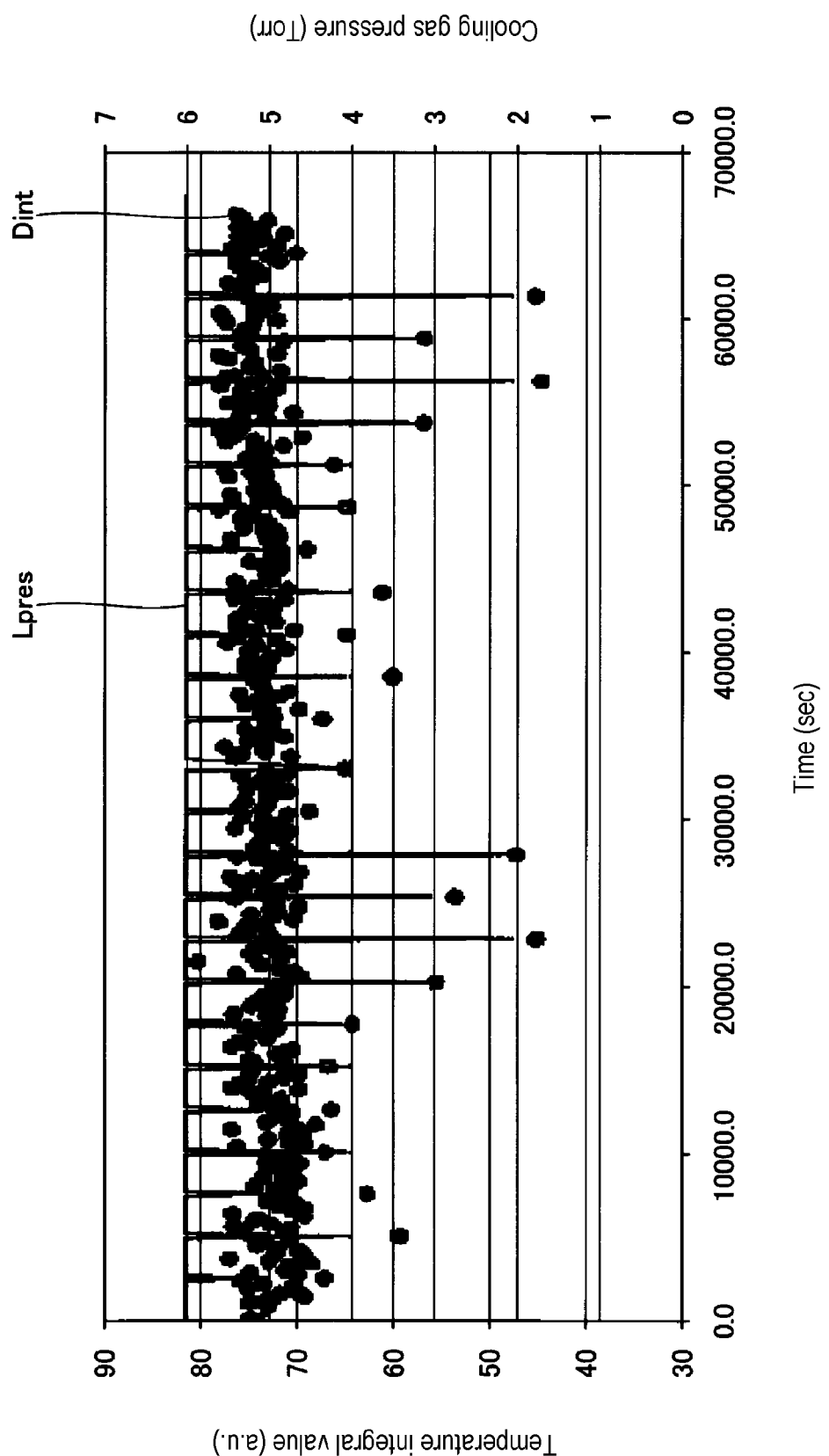
FIG. 8 is an exemplary diagram illustrating the abnormality detection method using the substrate processing apparatus of the semiconductor manufacturing apparatus according to the present embodiment.

Next, the substrate processing process is performed plural times while changing the pressure of the cooling gas, and the temperature integral value (difference integral value WS) is calculated. The results are shown in FIG. 8. The line Lpres in FIG. 8 indicates the pressure of the cooling gas. The point Dint indicates the temperature integral value.

Figure 9:
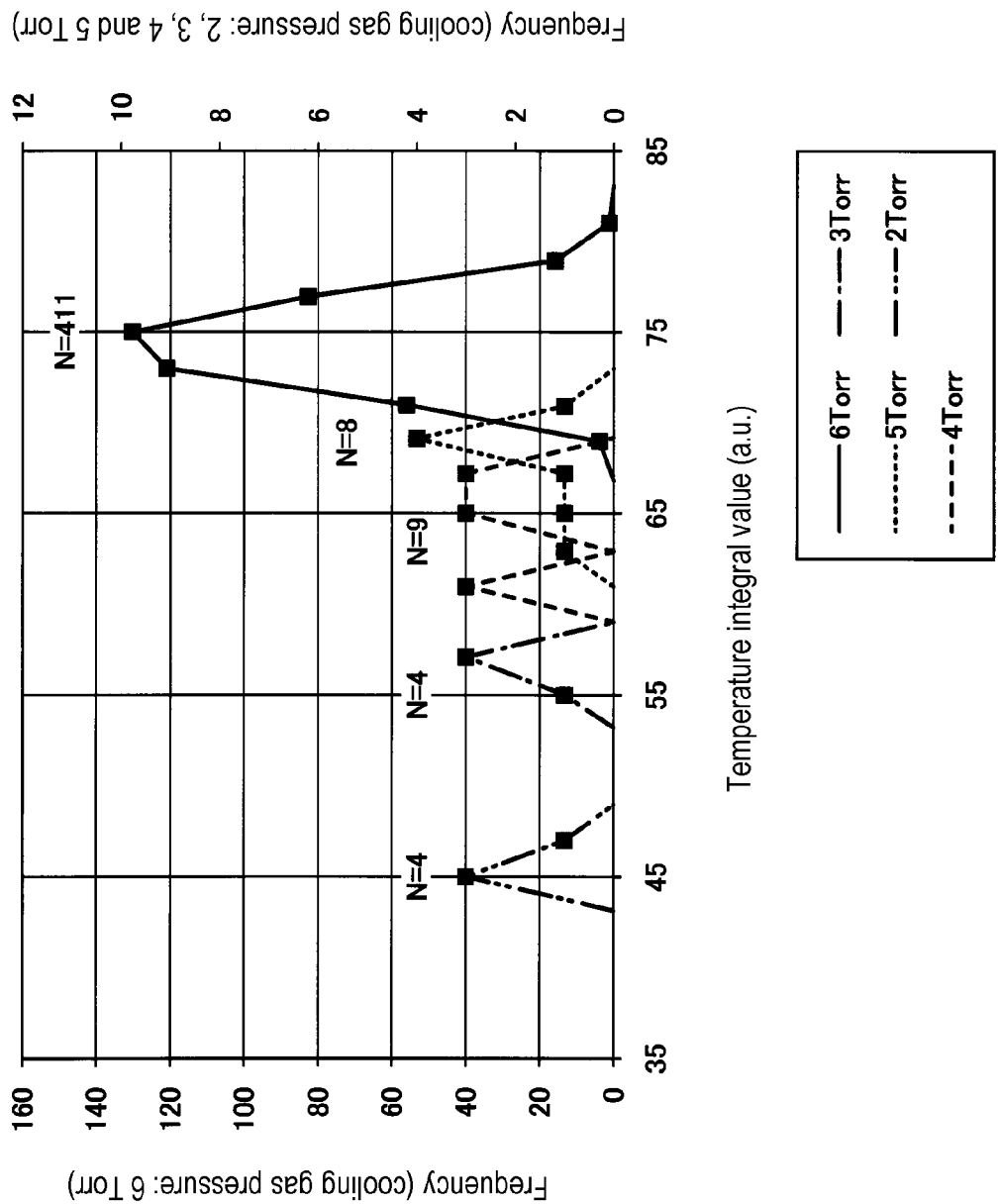
FIG. 9 is an exemplary diagram illustrating the abnormality detection method using the substrate processing apparatus of the semiconductor manufacturing apparatus according to the present embodiment.

In addition, the frequency distribution of the measured results is shown in FIG. 9.

From the results shown in FIGS. 8 and 9, it can be noted that the temperature integral value becomes small when the pressure of the cooling gas is low. Therefore, it can be determined that the pressure of the cooling gas is abnormal by performing the threshold value processing on the temperature integral value by a predetermined threshold value (e.g., 65). That is, it is possible to detect an abnormality in the attraction of the substrate W by the electrostatic chuck 65 based on the fluctuation in the temperature of the stage 60 caused by the attraction of the substrate W by the electrostatic chuck 65.

The evaluation index of temperature fluctuation is not limited to the above-mentioned difference integral value WS. For example, a peak value (maximum reached temperature), a maximum value, an extremely large value, etc. of the temperature fluctuation may be used.

It should be considered that the present embodiment disclosed herein is exemplary in all respects and not limitative. The above-described embodiment may be modified and improved in various forms without departing from the scope of the appended claims and the gist thereof. The matters described in the above-described embodiment may have other configurations within a consistent range and may be combined within a consistent range.

According to the present disclosure in some embodiments, it is possible to monitor whether a processing target substrate is attracted to a stage by an electrostatic chuck.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    a stage having an electrostatic chuck configured to attract a substrate;
    a temperature sensor arranged in the electrostatic chuck and configured to measure a temperature of the stage;
    a temperature converter connected to the temperature sensor and configured to convert a signal from the temperature sensor into a temperature signal; and
    a controller configured to detect an abnormality caused by attraction of the substrate by the electrostatic chuck when a temperature of the substrate is higher than the temperature of the stage before the attraction, based on an integral value obtained by integrating a difference between a reference temperature value as a reference and a temperature value of the stage during a step of processing the substrate, the reference temperature value and the temperature value of the stage being obtained based on the temperature signal output from the temperature converter, and the temperature value of the stage fluctuating depending on an amount of heat transferred from the substrate to the electrostatic chuck when the substrate is attracted by the electrostatic chuck.

2. The apparatus of claim 1, wherein the reference temperature value is a temperature value of the stage before attracting the substrate.

3. The apparatus of claim 1, wherein the controller is configured to detect the abnormality based on a value of a maximum reached temperature of the stage.

4. An abnormality detection method for a substrate processing apparatus provided with a stage having an electrostatic chuck configured to attract a substrate, a temperature sensor arranged in the electrostatic chuck and configured to measure a temperature of the stage, and a temperature converter connected to the temperature sensor and configured to convert a signal from the temperature sensor into a temperature signal, comprising:
    detecting an abnormality caused by attraction of the substrate by the electrostatic chuck when a temperature of the substrate is higher than the temperature of the stage before the attraction, based on an integral value obtained by integrating a difference between a reference temperature value as a reference and a temperature value of the stage during a step of processing the substrate, the reference temperature value and the temperature value of the stage being obtained based on the temperature signal output from the temperature converter, and the temperature value of the stage fluctuating depending on an amount of heat transferred from the substrate to the electrostatic chuck when the substrate is attracted by the electrostatic chuck.

5. The method of claim 4, wherein the reference temperature value is a temperature value of the stage before attracting the substrate.

6. The method of claim 4, wherein in detecting the abnormality, the abnormality is detected based on a value of a maximum reached temperature of the stage.

* * * * *